United States Patent [19]
Dornberger et al.

[11] Patent Number: 5,868,831
[45] Date of Patent: Feb. 9, 1999

[54] PROCESS FOR CONTROLLING THE GROWTH OF A CRYSTAL

[75] Inventors: Erich Dornberger; Wilfried Von Ammon, both of Burghausen; Hans Ölkrug, Tittmoning; Franz Wasmeier, Burghausen, all of Germany; Francois Dupret, Ottignies, Belgium; Vincent Wertz, Brussels, Belgium; Nathalie Van den Bogaert, Mozet, Belgium

[73] Assignee: Wacker Siltronic Gesellschaft für Halbleitermaterialien AG, Burghausen, Germany

[21] Appl. No.: 878,915

[22] Filed: Jun. 19, 1997

[30] Foreign Application Priority Data

Jun. 27, 1996 [EP] European Pat. Off. .............. 96110356

[51] Int. Cl.$^6$ .................................................. C30B 15/20
[52] U.S. Cl. ............................ 117/15; 117/201; 117/900; 219/390; 356/372
[58] Field of Search .............................. 117/15, 200, 201, 117/202, 900; 219/390; 356/372

[56] References Cited

U.S. PATENT DOCUMENTS

| | | | |
|---|---|---|---|
| 3,621,213 | 11/1971 | Jen et al. ................................. | 117/202 |
| 3,761,692 | 9/1973 | Cope ....................................... | 117/202 |
| 4,565,598 | 1/1986 | Seymour .................................. | 117/15 |
| 4,943,160 | 7/1990 | Gevelber et al. ........................ | 356/372 |
| 4,952,780 | 8/1990 | Curreri et al. .......................... | 219/390 |

OTHER PUBLICATIONS

Digital Control of Czochralski growth of Gllium Arsenide. System Reference Manual; Rirdling, K.; Coll. Eng. Appl. Sci., Arizona State Unvi., Tempe, AZ; Report (1988), Order No. AD–A191997, 436 pp. (Abstract only!).

F. Dupret et al., Int. J. Heat Mass Transfer, 33 (1990), No. 9, pp. 1849–1871 "Global modelling of heat transfer in crystal growth furnaces".

M. J. Crochet et al., J. of Cryst. Growth, 97 (1989) 173–185, "Numerical Simulation of Crystal Growth in a vertical Bridgman Furnace".

F. Dupret, N. van den Bogaert in: Handbook of Crystal Growth, vol. 2b, Chapter 15, edited by D.T.J. Hurk, North, Holland, (1994) "Modelling Bridgman and Czochralski Growth".

R. Assaher et al. "Dynamic Global Simulation of Bulk Crystal Growth under the Influence of an Axisymmetric Magnetic Field".

Proceedings of the Second International Conference on Energy Transfer in Magnetohydrodynamic Flows, Aussois, France, 1994.

*Primary Examiner*—Felisa Hiteshew
*Attorney, Agent, or Firm*—Collard & Roe, P.C.

[57] ABSTRACT

A process and an apparatus control the growth of a crystal, which growth is governed by a set of measurable and non-measurable variables. The process includes establishing an on-line simulation software working with a reduced number of variables, the reduction of variables being performed by using a projection algorithm; speeding up the on-line simulation software by generating data banks in which values of off-line precalculated variables are stored; tuning the on-line simulation software by adjusting the results predicted by on-line simulations to the results obtained by off-line simulations and by measurements; and establishing a control loop and controlling at least one of the variables in real time, the control loop using the speeded up and tuned on-line simulation software as an on-line observer.

4 Claims, 2 Drawing Sheets

PROCESS FOR CONTROLLING THE GROWTH OF A CRYSTAL

BACKGROUND OF THE INVENTION

1. Field of the Invention

The present invention relates to a complete multi-variable predictive control system for the regulation of single crystal growth processes.

2. The Prior Art

The growth of large single crystals of a specified quality is an important factor in many high-tech applications, such as electronic devices, fiber optics converters, lasers or infrared lenses. While many processes and variants can be used for this purpose, the most common way to grow large crystal boules is to resort to the Czochralski, Float Zone, Horizontal Bridgman, or Vertical Bridgman technique. With regard to the production of crystalline films, epitaxy is the most common technique.

Czochralski Growth

In the Czochralski method, which represents the most frequently used apparatus, a heater (often an ohmic resistor) radiates heat energy towards a crucible containing the molten material, so as to maintain the material above its solidification temperature.

A liner may separate the crucible from the melt. In the case of liquid encapsulated growth, a particular encapsulant covers the melt to prevent evaporation of volatile components. An alternative method for supplying energy to the crucible and the melt, which is frequently used to grow oxide crystals, is to utilize an induction heating system. In this system, a strong alternating current is applied to the coil which generates heat directly within the crucible and/or the melt.

At the outset of the process, a crystal seed is dipped into the liquid and then slowly pulled while a cylindrical crystal is progressively grown. The crystal radiates heat towards the surrounding environment, which consists of the outer shell of the furnace (cooled by water circulation) and, in some cases, of a highly pressurized gas. In this latter situation, the release of heat by conduction and convection into the gas may be important. It is in practice necessary to cause both crystal and crucible to rotate around the vertical axis, in order to ensure axis symmetry of the overall process. This will also control the buoyancy driven flow in the liquid.

The solidification front between crystal and melt is the place where interactions between the liquid and solid phases take place. A major difficulty in the growing of high quality crystals often occurs due to the dependence of interface shape and segregation upon the melt flow pattern. Melt convection can be induced by temperature or solute gradients within the liquid (natural or thermosolutal convection). It can also be induced by surface tension gradient in the liquid-environment interface (Marangoni convection). In semiconductor growth, the Grashof number of the flow is fairly high, which may give rise to an oscillating or even turbulent behavior in the melt. These effects may have severe drawbacks, such as crystal striations. A solution to reduce their importance is to generate a strong magnetic field, which plays a role as a vigorous brake in the flow.

The growth of oxide crystals presents some important differences with respect to semiconductors. While typical Grashof numbers are lower, heat transfer in the melt becomes convection dominated in view of the higher Prandtl number of molten oxides. Another peculiar feature is the importance of internal radiation, which may be a significant mode of heat transfer in the crystal.

Bridgman Growth

An alternative process is to resort to the horizontal or vertical Bridgman technique. Here, the molten material is contained in a cylindrical ampoule, at the bottom of which solidification starts from a crystal seed (after back-melting). The outer thermal environment of the ampoule consists of a hot zone, an insulation and a cold zone. During growth, the ampoule is slowly shifted downwards. The temperature distribution induced by the outer environment in the solid and molten material shifts upwards accordingly, while keeping more or less the same axial profile. Hence, the melt solidifies progressively until the crystal is completely formed.

A major advantage of vertical Bridgman growth is that the solid phase is located under the liquid phase. Consequently, the temperature gradient is pointing essentially upwardly in the melt. If isotherms were exactly horizontal, the layered fluid would be perfectly stable with respect to thermal convection. The problems related to the onset of a buoyancy-driven flow in the melt are, therefore, strongly reduced (a destabilizing radial temperature gradient is however generally present). The situation is more complex when considering solutal convection, which may be important for a non-dilute alloy. Indeed, there is no general rule concerning the dependence of density with respect to solute concentration. There may be solute rejection or solute incorporation at the interface. Hence, the solutal field can have a priori a stabilizing or destabilizing effect. It is worth noting that melt convection outside the diffusion-controlled boundary layer can have a beneficial mixing influence on crystal uniformity.

An efficient way to control the temperature gradient at the outer surface of the crystal and the melt is to replace the classical Bridgman apparatus by a dynamic gradient freeze apparatus. Basically, the heating system consists of a set of controlled annular elements monitored by appropriate thermocouples, which are mostly placed around the periphery of the growth vessel. It is no longer necessary to let the ampoule move downwards in the vessel, since the evolution of the outer temperature profile is achieved by a slow vertical shift of power supply in the heating elements.

Floating Zone Growth

In the Float Zone technique, the material is in the form of a free-standing rod clamped only at its ends, in which a small zone is melted by suitable heating equipment. The melt is suspended like a drop between the two parts of the rod. The molten zone is moved through the rod over its whole length by heater or rod motion. A single crystal can be generated by spontaneous nucleation, or using a single-crystalline seed crystal as the initial part of the rod that is kept unmolten. Most of the time, the zone passage is moved upwardly, because in that case the process has a higher stability. Usually, the growing crystal and sometimes also the melting rod are rotated, mostly with different rotation rates or with counterrotation.

The shape and stability of the molten zone play an important role in floating zone melting. The melt is held against gravity essentially by surface tension. In general, a molten zone becomes more stable the higher its surface tension is, and the lower is its specific weight. Besides, additional forces can act on the melt. In particular, when a high frequency induction heating system is used in semiconductor growth, a skin effect generates non-negligible surface forces which help holding the molten zone up, while increasing melt convection.

Aqueous Solution, Flux, and Hydrothermal Growth

The aqueous solution growth technique can be used to grow several salt single crystals. A simple aqueous solution crystallizer commonly consists of a rotating shaft with perpendicular branches, with a seed crystal attached to each arm. The fluid flow so provided breaks up the boundary layer of rejected solvent, leads to somewhat faster growth, and allows one to obtain more perfect crystals than those grown in quiescent solutions. Supersaturation is maintained by slow cooling, the rates being indeed very slow (0.1° to 1° C. per day). This requires a very careful and reliable temperature control.

The flux growth process in analogous to crystal growth from aqueous solutions, but the solvent solidifies before reaching room temperature. The main advantage of this method is that crystals are grown below the melting temperature. If the material melts incongruently, i.e., decomposes before melting, or exhibits a phase transition below the melting point, one has indeed to look for growth temperatures lower than these phase transitions. Flux growth might thus be used when the melting temperature is very high, and is useful when the vapor pressure at the melting temperature is too high. Thermal strain is minimized, due to the relatively low growth temperature, the very small temperature gradients, and the free growth into a liquid, allowing for the formation of growth facets. The method is very versatile, since a solvent may be found for any material required to be in the form of a single crystal. Flux growth is also suitable for the growth of layers on single crystal substrates. The main disadvantages are the low growth rate and the faceted crystal form. Another disadvantage is the unavoidable presence of ions of the flux as impurities in the crystals, if the solvent contains additional elements. In general, crystal growth from the melt is preferable whenever possible. However, since often only small crystals are needed for basic investigations, the effort might be much smaller than that of melt techniques.

Some very large crystals can also be grown by hydrothermal synthesis. This technique consists in using aqueous solvents or mineralizers under high temperature and pressure, in order to dissolve and recrystallize materials that are relatively insoluble under ordinary conditions. Usually, in hydrothermal growth, dissolution is carried out at the lower hotter zone (nutrient zone) and crystallization is carried out at the upper cooler zone (growth zone). Natural convection currents created by the temperature gradient carry the material from the nutrient zone to the growth zone. Note that there are hydrothermal experiments carried out under extreme pressure conditions (less than 1 bar and greater than 10 kbar).

Physical Vapor Transport Growth

Bulk crystal growth can sometimes be performed by physical vapor transport. The advantage of these techniques is that crystals tend to have a low concentration of point defects, and low dislocation densities, compared to crystals grown from the melt. The reason is that temperatures are usually considerably lower than the melting temperature. Moreover, if the material undergoes a phase transformation, or if it melts incongruently, vapor growth can be the only choice for the growth of single crystals. Compared to melt growth, a disadvantage of vapor growth is however the relatively low growth rate typically encountered.

Several classes of techniques exist for the growth of bulk single crystals from the vapor phase. They are differentiated by the nature of the source material (e.g., whether it is solid or vapor) and by the mechanisms by which it is transported to the growing crystal surface. The conceptually simplest technique is that of sublimation. Here the source material is placed at one end of a sealed tube and heated, so that it sublimes. Then it is transported to the colder region of the tube where it crystallizes. If the source material is a dissociable compound, then the result is dissociative sublimation. Here the transport processes are more complex; and crystal stoichiometry becomes an issue to be considered.

To further control the transport processes, an inert carrier gas can be introduced into the sealed tube. Transport can be facilitated by means of a reversible chemical reaction. Here an active vapor species (often a halogen) reacts with the charge to produce a volatile species (a halide), which is transported to the crystallization zone. There, the reaction is reversed, leading to the deposition of the element or compound to be crystallized with release of the carrier (halogen), which is recycled.

Epitaxy

Thin film deposition processes are related to the bulk growth techniques in many aspects. In summary, one or several very thin layers of material are deposited onto a crystalline substrate to form a layered crystalline film. In epitaxial growth, many methods deal with continuum mechanics, namely liquid and solid phase epitaxy. This includes halogen transport epitaxy, levitation epitaxy and organo-metallic vapor phase epitaxy. All these techniques are very slow, but will produce very high quality products.

Factors Affecting Crystal Quality

Regardless which growth technique is considered, the crystal quality is affected by three factors. These factors include the regularity of the lattice, the presence of impurities in the product, and the inhomogeneity of the crystal stoichiometry.

Lattice defects can take the form of interstitials and vacancies, which are in part generated along the solidification front. Lattice deflects can diffuse and recombine according to complex thermally dependent kinetics. Dislocations or other irregularities, such as twins, grain boundaries, etc. are often induced by the thermal stresses which take place in the crystal near the solid-liquid interface. A key ingredient for obtaining high quality crystals is therefore to control accurately the evolution of the temperature field in the solid during and after growth. This can be achieved by regulating the thermal environment of the growing crystal and, in particular, by using radiative heat shields.

On the other hand, impurities can be incorporated into the crystal during the growth process. This can occur after having been transported through the melt from the surrounding atmosphere and container such as a crucible or an ampoule. This can also occur as a consequence of an imperfect initial composition of the raw material.

The third problem, which can occur when compounds or alloys are grown, is segregation. When several ions or molecules are present in the melt, the composition of the grown crystal can vary axially and radially. This is due to a preferential incorporation of one constituent in the solid phase. Segregation is mostly governed by the melt flow and, to a much lesser extent, by thermal effects. This is because the melting temperature can depend on crystal and melt composition. Obtaining a uniform crystal composition is of course a key objective when e.g., Periodic Table Group III–V compounds (such as GaAs crystals) are grown.

Although any growth process involves peculiar difficulties, these are in general quite similar in nature and can be related to the three main quality factors hitherto described.

The preferred objective considering the Czochralski process (Cz process) is to produce crystals whose diameter is almost constant and whose quality is the highest possible. This is a difficult objective, since most relevant physical quantities, such as interface deflection, growth speed of the lattice, etc., which characterize crystal quality, cannot at all be measured during growth. This is due to (1) the high temperatures prevailing during the process; (2) the extreme sensitivity of the crystal lattice with respect to any change to the environment of the liquid-solid interface; (3) the inherent batch nature of the process; and (4) the high sensitivity to any contamination.

Silicon Growth

In particular, the quality of silicon crystals is specified according to the requirements of the end user. Such specifications for the bulk quality include the concentration of oxygen, the resistivity, the density of micro defects and the maximum concentrations of metallic impurities, e.g., Fe, Cu. A case of particular interest is the problem of oxygen incorporation in silicon crystals grown by the Czochralski process. As only quartz crucibles can be used, the solid $SiO_2$ is dissolved partly into the melt and is evaporated mostly from the melt-gas interface. A fraction of the oxygen remains however dissolved in the liquid and arrives at the crystal-melt interface, where a significant amount is incorporated into the solid. The presence of oxygen in silicon crystals gives rise to positive and negative quality aspects. Oxygen precipitates (BMD) in the center of the wafer getter metallic impurities during device manufacturing, which reduces current leakage. The dissolved oxygen in the wafer hardens the silicon lattice and makes it less susceptible for geometrical deformations. On the other side, BMD are detrimental for the devices, if they are located near the wafer surface. In this respect, the objective is to obtain a very homogenous and reproducible oxygen content in the crystal within tight specifications.

The concentration of dopants, such as B, P, As, Sb, determines the resistivity of the wafers. In order to obtain a high yield in device manufacturing, tightly specified ranges of dopant concentrations have to be incorporated homogeneously into the crystal.

However, during growth, the concentration of oxygen and dopants are non-measurable parameters, which significantly determine the quality of silicon crystals. Usually, the optimization of oxygen and dopant incorporation into the crystal is done by trial and error. Therefore, the development of crystal growth processes is very time consuming and expensive.

During growth, so-called as-grown defects form, including vacancies, self-interstitials, oxygen and other impurity atoms, which diffuse and react with each other according to complex thermally dependent kinetics. Thus, a key ingredient for obtaining high quality crystals is again to control accurately the evolution of the temperature field in the solid during and after growth. This can be achieved by regulating the thermal environment of the growing crystal. In Czochralski silicon growth, peculiar components act as radiative heat shields. The pull rate is selected in such a way that the thermal history of the crystal fits with the best experimental results.

Measurement Techniques

Temperature measurements are very difficult to perform at high temperatures, since thermocouples can easily experience fast degradation, loss of accuracy etc. Pyrometers are in principle less accurate and are more difficult to calibrate. Any on-line intrusive measurement in the melt (or the gas in physical vapor growth) is strongly prohibited, since the melt (or gas) composition cannot at all be modified during growth. This is due to the severe composition requirements of most single crystals in high-tech applications.

Possible Control Strategies

A single control strategy is not at all feasible, since the system geometry can undergo quite important changes during full crystal growth. In particular, the Cz process can be subdivided in several stages: melt down and stabilization, seeding, cone growth, roll-over or shouldering, body growth, tail-end growth and after-heating. An optimal control structure would therefore require the use of a system of controllers that can continually adapt to the evolution of the geometry. This would be dictated by the crystal length increase and the melt volume decrease. Besides these difficulties, the growth control strategy is however facilitated in most cases by the process slowness. (Growing semi-conductor crystals can take several hours, or even a full day. Growing oxide crystals can take several days, or even weeks.)

Off-Line Control

In Czochralski growth, present control devices are able to control the diameter or the weight of the solidified crystal. These are the only easily measurable quantities, and the control device acts on the pull rate and the heater power. No on-line quality control is presently available, and quality can only be controlled by off-line numerical simulations (with a view to adapting the processing conditions). Finite element codes, such as 'FEMAG', are devoted to performing off-line simulations (F. Dupret, P. Nicodeme, Y. Ryckmans, P. Wouters, M. J. Crochet, *Int. J. Heat Mass Transfer*, 33 (1990) 1849; M. J. Crochet, F. Dupret, Y. Ryckmans, F. T. Geyling, E. M. Monberg, *J. Cryst. Growth*, 97 (1989) 173; F. Dupret and N. van den Bogaert, in: Handbook of Crystal Growth, Vol. 2b, Chapter 15, edited by D. T. J. Hurle, North, Holland, (1994); R. Assaker, N. van den Bogaert, F. Dupret, "Dynamic Global Simulation of Bulk Crystal Growth Under the Influence of an Axisymmetric Magnetic Field", Proceedings of the Second International Conference on Energy Transfer in Magnetohydrodynamic Flows, Aussois, France, 1994). These simulations are employed to predict the temperature distribution and the shape of the free boundaries in all parts of a crystal puller. This includes the crystal, the melt, the crucible, the graphite susceptor, the heater and several insulators as a function of time, if necessary. The reference discusses in detail the underlying physical and numerical principles of the finite element code 'FEMAG', which are summarized in this section. Based on the assumption of an axial symmetric furnace geometry, the code takes into account heat transfer by conduction in solid parts (e.g. crystal, heater, insulation) and radiation in the furnace enclosures. Convective heat transfer in the melt is computed by solving the complete Navier-Stokes equations with appropriate turbulence models. To reduce the computation time, it is possible as well to approximate the convective heat transfer in the melt by means of an enhanced equivalent thermal conductivity. Heat transport by inert gas convection is usually neglected in silicon growth due to low pressure (ca. 20 mbar). This effect can be modelled approximately, when necessary.

The shape of the solid/liquid interface, which is a priori unknown, is determined by the heat flux balance in the vicinity of the interface. That is, the heat flux $q_m$ from the melt to the interface and the heat generated by solidification $q_f$ is equal to the heat flux $q_c$ into the crystal. Additionally, the temperature at the solid/liquid interface $T_{sl}$ is presumed to be equal to the melting temperature $T_m$.

In the furnace enclosures, heat is transferred by radiation, which couples the heat fluxes that are emitted, absorbed and reflected by solid and liquid surfaces. While all surfaces are usually assumed to be gray emitters, a band energy approach can be used to model wavelength dependent properties. This is necessary for semi-transparent materials (such as encapsulant layers or quartz tubes). These are modelled as transparent in a given range of frequencies and as opaque in the remainder of the spectrum. Diffuse radiation is taken into account, while specular radiation is neglected. A modified Gebhard method was applied to calculate the incoming and outgoing heat fluxes from the surfaces. View factors are computed by taking viewed and hidden surfaces into account.

The heat transfer equations form a set of non-linear, coupled, axisymmetric two-dimensional partial-differential equations, which are solved numerically by the finite element method. Galerkin's method is applied for space discretization and the resulting set of non-linear algebraic equations is solved by Newton's method.

Data of the physical properties of all materials used in the simulations are required and can be selected from literature or from the suppliers of the consumables. Thermal boundary conditions at the furnace walls have to be defined, e.g. 320° K at the furnace walls.

Present Control Strategies In Silicon Growth

Each stage of the growth is generally controlled through a different strategy. The body phase regulation can include a system with two controllers. One controller will regulate the diameter, on the one hand by acting on the pull rate through a PD controller. The other controller will regulate the average pull rate, on the other hand by acting on the heater power through a PI controller. This regulation strategy for body growth is most often satisfactory with regard to the required set points for diameter or pull rate. However, control of the body phase for very large crystals is likely to represent a new difficulty. This is because the process during the body phase can no longer be considered as stationary, and might become unstable due to large time constants and response times of the power controller.

The difficulties of existing control strategies mainly deal with the regulation of the other stages of the process. During seeding and cone growth, only partial control is achieved. In particular, a predetermined heater power evolution can be applied, while diameter is controlled via the pull rate. Control of the stages of melt down, roll-over and tail-end is usually achieved by applying off-line precalculated set-point curves for heater power and pull rate. The control of the tail-end stage is a particularly difficult problem, since diameter cannot be measured today at this stage of growth.

Other drawbacks of the current control strategies are that crystal quality is not directly addressed on-line, but only indirectly through actions on the pull rate or the diameter.

SUMMARY OF THE INVENTION

A much better result could be achieved through an on-line control of the real quality criteria such as impurities, stresses, etc. As the growth process is usually very slow for most materials, techniques based on on-line calculations can be employed. These techniques will provide for the evolution of critical non-measurable physical quantities as the crystal growth proceeds.

It is an object of the present invention to develop an appropriate control system in order to improve the crystal quality in single crystal growth processes and to meet the more severe requirements that apply to crystals to be used in electronics, optics, etc.

The optimization of crystal quality is to be achieved by a direct control of the most relevant physical quantities which govern this quality. In the Czochralski silicon growing process, the functional dependencies of the quality parameters on the growth parameters are based upon macroscopic and microscopic axial and radial variations of the oxygen and dopant concentrations. These concentrations are functions of the pull rate, the crystal rotation, the crucible rotation, the inert gas flow, the melt level, the heating system, etc.

However, since these physical quantities can, most often, not be measured during growth, models which allow for the evaluation of such variables in real time have been developed.

It is another object of the present invention to use multivariable predictive control strategies. These are based on the use of on-line simulations of the above mentioned models in the control loop, in order to be able to achieve accurate control of process variables including non-measurable variables.

The above objects are achieved according to the present invention by providing a process for controlling the growth of a crystal, comprising the steps of:

establishing an on-line simulation software working with a reduced number of variables, and a reduction of the variables being performed by using a projection algorithm;

speeding up the on-line simulation software by generating a data bank in which values of off-line precalculated variables are stored;

tuning the on-line simulation software by adjusting results predicted by on-line simulations to the results obtained by off-line simulations and by measurements; and establishing a control loop and controlling at least one of the variables in real time, the control loop using the speeded up and tuned on-line simulation software as an on-line observer.

The present invention also provides an apparatus for controlling the growth of a crystal, comprising:

a) a crystal pulling means for pulling a single crystal from a melt;

b) process control means for controlling the crystal pulling means;

c) on-line simulation means for providing the process control means with on-line predicted values of parameters influencing the pulling of the crystal;

d) data bank means for speeding up the on-line simulation means by providing data of on-line predicted values and off-line calculated values of parameters influencing the pulling of the crystal; and e) off-line simulation means for providing the process control means, the on-line simulation means and the data bank means with off-line calculated values of parameters influencing the pulling of the crystal.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawing, wherein similar reference characters denote similar elements throughout the several views.

DETAILED DESCRIPTION OF PREFERRED EMBODIMENTS

Figure 1:
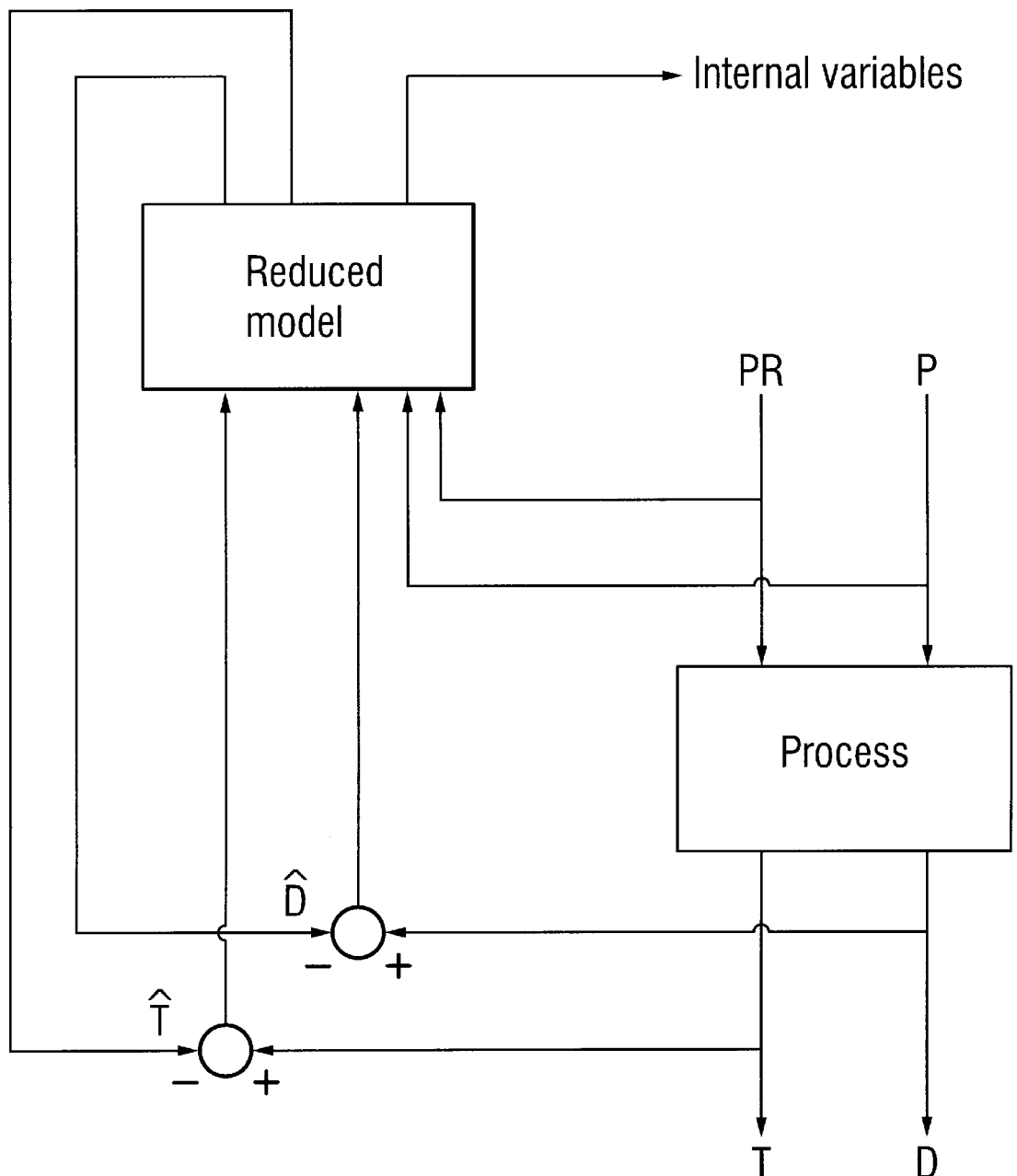
FIG. 1 refers to the on-line tuning of a reduced model which is based on a detailed distributed parameters model.

The on-line simulations are based on a distributed parameters model, which is a model based on partial differential equations describing the major physical laws governing the process. These simulations can predict the evolution of some of the process variables; and these predictions will be used in a predictive control scheme for better control of the process.

The inventive concept can be applied to any bulk crystal growth process, such as Czochralski, liquid encapsulated Czochralski, Bridgman, float zone or even any kind of epitaxial growth processes. The main common features of these processes are as follows. The processes are slow, with characteristic time constants on the order of 10 minutes to several hours. The models for these processes are usually based on several PDEs describing the heat transfer and mass transfer and the interface shapes in various regions of the apparatus. The models are complex, due to the nature of the problem itself (crystallization of a liquid phase), due to the various components that need to be modelled, and due to the influence of convection, and due to the presence of boundaries, etc. The main variables which need to be controlled accurately in order to improve the quality of the crystal, and even the stability of the process itself when large crystals are grown, are non-measurable.

A successful implementation of this invention relies on four main steps, which are here described in the case of the Czochralski growth of silicon, but are also valid for other materials and techniques, as follows.

A reduced model, or a simplified version, is established for a detailed off-line simulation software (for Czochralski growth, this is, for example, the FEMAG software). This is in order to speed-up the computations by reducing significantly the number of unknowns characterizing the thermal environment and the geometry of the crystal and the melt, so that this reduced model can be used on-line. This means that simulations run much faster than the real process. This reduction is performed using a projection algorithm. Some parameters governing the reduced model are fine tuned by fitting the results with detailed simulations.

In order to increase the computation speed even more, data banks are used which are generated by off-line simulations using the detailed simulation software. They are used to store values for the radiative matrices and for the melt flow stream function, for different geometries. During on-line simulation, interpolation between selected radiative matrices and stream functions are performed as a function of the current growth parameters.

For the reduced model to be used on-line as an estimation for non-measurable variables, an adjustment of this model is necessary. This adjustment is done both off-line, from a comparison between the results of the detailed model and the reduced model. Also, this adjusting or tuning is on-line, in real time, during the actual growth of the crystal, by comparison between computed values and measured values of some of the process variables. Some material constants will then be adjusted on-line so that the simulated variables and the predicted variables will be close to their correct (i.e. measured) values.

Once the reduced model operates on-line as a reliable observer of the process variables, it is used to generate predictions of those variables of the process which need to be controlled. This can include measured variables, as for instance, the pull rate which is necessary in order to obtain a specified diameter. This can also include unmeasured variables which are strongly linked to the quality of the crystal, as for example, interface shape or temperature field on the wall of the crucible. Multivariable predictive control techniques are based on the minimization of a performance index. This includes taking into account the difference between predicted values and desired values for the controlled process variables, which will then be applied to control the real process variables.

These four steps are described in more detail below. The description is based on the Czochralski crystal growing process.

For the complex system of crystal growth, different simulation models (e.g. FEMAG) have been developed using finite element techniques or finite volume techniques. These models are detailed global models, since the various heat transfer modes are taken into account. This includes conduction and radiation within and between the constituents, convection in the melt and release of solidification heat at the solid-liquid interface. The equations describing the process are non-linear partial differential equations or integral equations. In order to solve these equations, one relies on a fine space discretisation (commonly using finite elements) together with time discretisation (e.g. using an implicit Euler method). The reduced model, aimed at reducing significantly the computing time, is based on a projection technique.

A preferred description of the system is obtained by subdividing the furnace into a set of macro-elements, which can be "radiative" (the furnace enclosures), "two-dimensional" (e.g., the solid bodies), or "one-dimensional" (the thin shells). The melt-crystal is a particular two-dimensional macro-element, whose shape is a priori unknown, and where latent heat is released at the solid-liquid interface. The set of interfaces connecting the macro-elements constitutes the skeleton of the global domain. At any new time step, each macro-element includes a set of unknowns. These unknowns include the new nodal temperatures, represented by the vector T, the incremental generalized nodal heat fluxes on the skeleton, represented by the vector $Q^+$, and the geometrical unknowns, represented by nodal positions X. The nodal temperatures can be split into two parts, namely $T^+$, which represents the temperature on the skeleton, and $T^*$, which represents all other temperatures.

The objective of the reduced model is to build up a system of equations whose number of unknowns is much lower than that of the detailed model. For this purpose, the detailed discrete system is projected onto a reduced solution subspace:

$$T^+ = D^+ U^+, \quad U^+ \in R^n,$$

in which $U^+$ is the vector of reduced nodal temperatures on the skeleton. The size n of $U^+$ is much smaller than the size of $T^+$ (n<<N). The matrix $D^+$ is rectangular and depends on X (describing the positions of nodal unknowns). Reductions are defined considering each side of the skeleton separately. Typical simplifications consist in assuming a constant, piece-wise linear, or quadratic temperature profile along a given side.

The global vector of unknowns corresponding to the detailed model, $Z=[T^+, T^*, X, W]^T$, is thus reduced into $U=[U^+, T^*, X, W]^T$. The relationship between U and Z can be written as $$Z = D\ U,$$

where D is defined as follows:

$$D_{ij} = D^+_{ij} \text{ if } i \leq N \text{ and } j \leq n,$$

$$= \delta_{ij} \text{ if } i > N \text{ or } j > n.$$

Note that internal nodal temperatures in the furnace and geometrical unknowns are not reduced. This is because the idea is to maintain all details for what concerns the critical region (melt and crystal), while allowing simplifications in the other parts of the furnace. In order to keep the balance between equations and unknowns, the reduction in unknowns is performed together with a projection of the equations. This is basically achieved by multiplying the equations by the matrix $D_T$. The detailed discrete system of equations, which can be written in the following compact form at any time step:

$$A(X)Z + B(X)F(X)T^4 = E(X),$$

is, therefore, reduced in the following way:

$$D^T A(X)DU + D^T B(X)F(X)(D^+U^+)^4 = D^T E(X).$$

Hence, the system size is drastically decreased. There is no more need to use a decoupled scheme for finding the solution, and a coupled Newton-Raphson method is used.

The factor $(D^+U^+)^T$, which needs to be calculated for every iteration since the vector $U^+$ is modified, establishes an important computing time in the Jacobian evaluation. This is through matrix multiplications involving as a first factor a submatrix of size (n×N) of $D^T B(X)F(X)$, and as a second factor the matrix $4(D^+U^+)^3 D^+$, of size (N×n). A simple solution to decrease the cost of this amount of computing time is to define the following approximation:

$$(D^+U^+)^4 \approx D^+(U^+)^4,$$

which can be shown to be satisfactory as long as the reduced nodes are not too sparsely arranged on the matrix skeleton. With this approximation, it becomes necessary to calculate only the product of a submatrix of size (n×n) of $D^T B(X)F(X)D^+$ by the vector $4(U^+)^3$, of size n, which takes much less time and is thus much cheaper.

Further improvements are available by using the following points. Instead of using the previous approximation, the following alternative approach can be introduced:

$$(D^+U^+)^4 = (\bar{D}DU^+)^4 \approx \bar{D}(\tilde{D}U^+)^4$$

in which a different vector of reduced unknowns, $\bar{U} = \tilde{D}U$, is used for the radiative sides. The size of this vector is $n_s$, with $n < n_s << N$; and this approximation is more accurate than before.

It is important to ensure that essential boundary conditions, which are imposed along the external wall of the furnace, be exactly (and not approximately) verified on the reduced nodes. This is done by having the projection matrix DT slightly modified into another matrix D* with respect to these conditions.

With such improvements, the system can be written in the form:

$$D^*A(X)DU + D^*B(X)F(X)\bar{D}(\tilde{D}U^+)^4 = D^*E(X).$$

The reduced model described so far can be shown to be very accurate, provided the node arrangement and the reduced interpolation functions can be selected in order that the reduced and the detailed simulations fit well together.

Besides reducing the size of the system through a projection onto a reduced solution subspace, an important ingredient of the method of the invention is to avoid expensive calculations during on-line simulations. This is done by storing some information, which is computed beforehand, into a data bank, and by accessing it as necessary. Two main classes of information are stored in this way, namely the radiative matrices BF and the stream function characterizing the melt flow. Radiative matrices are pre-calculated for different geometries, i.e. for different combinations of crystal length, and previous and current growth angles. For every crystal length, a small number of values for the current and previous growth angles are considered. Moreover, the radial positions of the nodes defining the crystal wall are imposed to be the prescribed crystal radius. An exception is for the trijunction node and a few nodes located just above it, whose radial positions remain free. The error introduced by such an approximation is negligible, for the crystal radius is to be maintained constant in the process. Also the detailed shape would anyhow be very close to a cylinder. Storing precalculated radiative matrices allows the saving of computer time; moreover, the method is also inexpensive in terms of disk space. This is because the information which is stored is the projected matrix, $(D^+)^T BFD^+$, of size (n×n) (or $(D^+)^T BF\bar{D}$, of size (n×$n_s$)), which is much less than the original matrix BF.

A similar method is applied for the melt flow. The Stokes stream function is pre-computed by means of quasi-steady state simulations for different combinations of melt height, crystal and crucible rotation rates, pull rate or any other parameter (such as magnetic field strength). This information is stored in the data bank. During real-time simulation, interpolation between selected radiative matrices and stream functions are performed as a function of the current growth parameters.

Once the reduced model has been designed with computation times compatible with real time control of the process, there are different ways to introduce this model inside a control loop. The possible options share a common feature. One needs to be sure that the variables which are predicted or estimated by the reduced model do not drift away from their actual values on the process itself. This is important even though these actual values are usually not measurable. An on-line adjustment mechanism is hence necessary, which makes sure that the reduced model behaves similarly to the actual process when the same input variables such as pulling speed, heating power, etc. are applied to both. The equations describing the process and which are integrated into the reduced model depend on several parameters which are essentially material constants, that are not always accurately known. The adjustment of the reduced model is performed on some of these parameters. This adjustment is based on deviations between computed values and measured values for some process output variables, such as the diameter and one or two temperature measurements.

FIG. 1 illustrates the on-line tuning or adjusting mechanism which transforms the reduced model into an estimation for internal process variables. The reduced model is running on-line, using actual values for some of the input variables. For instance, it can use the actual power and pull rate, measured in the real process, to compute the solution of the PDEs. This solution will give the behavior of all other process variables. Some of these process variables can be measured in the real process and their measured values compared to the computed ones. Some parameters of the reduced model, typically some poorly known material constants, are then adjusted on-line in such a way that the difference between computed values and measured values decreases with time. Different observer structures can be designed, according to which variables are chosen to act as inputs into the reduced model. Variables which are selected can be tuning adjusting variables, and parameters which are used are for the tuning mechanism.

In all cases, once the reduced model works well, the difference between measured and computed variables becomes small enough, so as to be negligible. Then the other internal variables, which are computed by the reduced model but cannot be measured, can be used in a control loop.

The internal variables whose future behavior can be predicted by the reduced model, are used in a multivariable predictive control loop. Crystal quality requirements are first transformed into set-point curves for some of these process variables. Then, a controller is designed which minimizes, over the set of admissible trajectories for the control variables, the mean squared future deviations between the set-point curves and the predicted values. The criterion to be minimized may also include a second term, which takes into account the control energy which is required to achieve the objective. Typically, the criterion can be expressed in the following form:

$$J(t) = \sum_{i=1}^{N_y} (\hat{y}(t+i) - y^*(t+i))^T Q (\hat{y}(t+i) - y^*(t+i)) + \sum_{i=0}^{N_y-1} \Delta u(t+i)^T R \Delta u(t+i)$$

where ŷf(t+i) is a vector containing the predicted values of the process variables to be controlled at time t+i,y*(t+i) is the vector of set values for these variables and Δu(t+i) is the vector of control increments. The prediction horizon $N_y$, the control horizon, $N_u$, and the weighing matrices Q and R are tuning or adjusting parameters for the general control algorithm.

Since the model is highly nonlinear, minimization can be performed in at least three different ways, as follows. A nonlinear optimization algorithm can be used to search for a global minimum of the criterion. This way may be excessively costly in terms of computing time. One can compare values of the criterion for different possible control trajectories and select the best one. A satisfying control trajectory can be constructed on line by coupling the reduced model, working as a predictor, with a controller in a closed loop simulation.

Depending on the global quality control objectives, several different internal variables may be selected as variables to be controlled and as control variables.

With regard to the silicon Czochralski growth technique, measurable and non-measurable variables are preferably selected from the following group. This group comprises pulling speed, heating power, temperature distribution in the crystal, melt flow pattern, temperature distribution at the inner surface of the quartz crucible, temperature distribution on the melt surface, solid/liquid interface shape and evaporation of SiO. The oxygen and dopant concentration are controlled in such a way that the microscopic and macroscopic concentration variations are small in axial and radial direction of the crystal. Moreover, the axial oxygen content is preferably influenced by on-line controlling of some non-measurable parameters. These parameters include the temperature distribution at the inner surface of the quartz crucible ($SiO_2$ dissolution) and the evaporation rate of SiO from the melt surface. Finally, it is preferred to control the cooling of the growing crystal and in order to limit as-grown defects and to satisfy required specifications.

Figure 2:
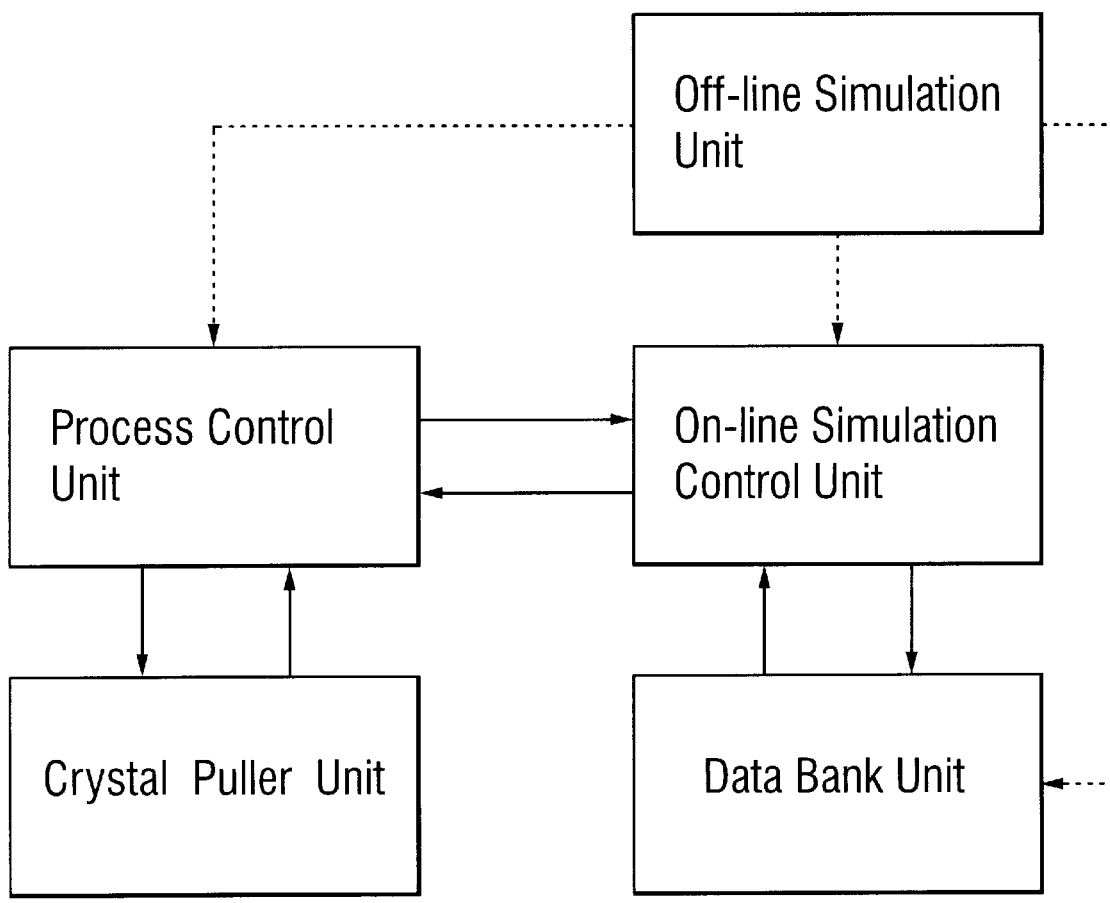
FIG. 2 refers to an apparatus which is suitable to perform the process of the invention.

FIG. 2 shows an apparatus which is suitable to perform the process for controlling the growth of a crystal. The apparatus comprises five units, which are connected. An off-line simulation unit predicts optimized process parameters, such as heater power, pull rate and rotation speeds of crystal and crucible (if, as an example, a Czochralski process is considered). These parameters are introduced into the process control unit. The on-line simulation control unit receives the same parameter sent from the off-line simulation.

The crystal growth process (crystal puller unit) is controlled by the process control unit. Measurable parameters are fed back from the puller unit to the process control unit. The on-line simulation unit performs on-line simulations of the growth process in parallel. The on-line simulation unit receives the measurable parameters from the process control unit and compares them with the predicted values. The on-line simulation control unit sends new, predicted values for the future growth to the process control unit. The process control unit controls the crystal puller unit with the new values.

A data bank unit is required to speed up the on-line simulation control unit. Process data from the off-line simulation unit and from the on-line simulation control unit are stored in the data bank. From here, they can be retrieved by the on-line simulation control unit. The data bank unit contains permanent data from the off-line simulation unit and data that are updated at certain times by the on-line simulation control unit.

The present invention has the following advantages. On-line simulation based control, that includes functional dependencies for non-measurable quality parameters with respect to growth parameters, can considerably reduce the cost of crystal growth development. Moreover, the run to run stability of a growth process can be improved by an on-line simulation based control.

While several embodiments of the present invention have been shown and described, it is to be understood that many changes and modifications may be made thereunto without departing from the spirit and scope of the invention as defined in the appended claims.

What is claimed is:

1. A process for controlling growth of a crystal, which growth is governed by a set of measurable and non-measurable variables, comprising the steps of:

establishing an on-line simulation software working with a reduced number of variables, a reduction in the number of variables being performed by using a projection algorithm;

speeding up the on-line simulation software by generating data banks in which values of off-line precalculated variables are stored;

tuning the on-line simulation software by adjusting results predicted by on-line simulations to results obtained by off-line simulations and by measurements; and establishing a control loop and controlling at least one of the variables in real time, the control loop using a speeded up and tuned on-line simulation software as an on-line observer.

2. A process as claimed in claim 1, wherein the measurable and non-measurable variables are selected from the group consisting of pulling speed, heater power, temperature distribution in the crystal, melt flow pattern, temperature distribution at an inner surface of a quartz crucible, temperature distribution on melt surface, solid/liquid interface shape and evaporation of SiO.

3. The process of claim 1, wherein the crystal is a semiconductor material.

4. The process of claim 1, wherein the crystal is silicon.

* * * * *